(12) United States Patent
Teman et al.

(10) Patent No.: US 8,531,873 B2
(45) Date of Patent: Sep. 10, 2013

(54) ULTRA LOW POWER SRAM CELL CIRCUIT WITH A SUPPLY FEEDBACK LOOP FOR NEAR AND SUB THRESHOLD OPERATION

(75) Inventors: Adam Teman, Ramat-Gan (IL); Lidor Pergament, Tel-Aviv (IL); Omer Cohen, Rishon LeZion (IL); Alexander Fish, Tel Mond (IL)

(73) Assignee: Ben-Gurion University of the Negev Research and Development Authority, Beer Sheva (IL)

( * ) Notice: Subject to any disclaimer, the term of this patent is extended or adjusted under 35 U.S.C. 154(b) by 193 days.

(21) Appl. No.: 13/103,091

(22) Filed: May 8, 2011

(65) Prior Publication Data

US 2012/0281458 A1    Nov. 8, 2012

(51) Int. Cl.
*G11C 11/44* (2006.01)
(52) U.S. Cl.
USPC .......................................... 365/156; 365/188
(58) Field of Classification Search
USPC .............................. 365/154, 156, 188, 189.04
See application file for complete search history.

(56) References Cited

U.S. PATENT DOCUMENTS

| | | | |
|---|---|---|---|
| 5,668,770 A * | 9/1997 | Itoh et al. ...................... | 365/227 |
| 6,487,127 B2 | 11/2002 | Johnson et al. | |
| 7,092,280 B2 | 8/2006 | Joshi | |
| 7,269,055 B2 * | 9/2007 | Lin et al. ...................... | 365/154 |
| 7,324,368 B2 * | 1/2008 | Wang et al. .................. | 365/154 |
| 7,460,400 B1 * | 12/2008 | Kikuchi ................... | 365/185.05 |
| 7,706,174 B2 | 4/2010 | Pradhan et al. | |
| 7,915,657 B2 | 3/2011 | Mikami et al. | |
| 8,009,500 B2 * | 8/2011 | Nii et al. ...................... | 365/226 |
| 8,279,660 B2 | 10/2012 | Perisetty | |
| 2003/0012049 A1 | 1/2003 | Itoh et al. | |
| 2004/0125644 A1 | 7/2004 | Komatsuzaki | |
| 2007/0081407 A1 | 4/2007 | Maki et al. | |
| 2007/0127298 A1 * | 6/2007 | Yamamura ............... | 365/189.09 |
| 2007/0236983 A1 | 10/2007 | Wang et al. | |
| 2007/0236985 A1 | 10/2007 | Edahiro et al. | |
| 2008/0117666 A1 | 5/2008 | Russell et al. | |

* cited by examiner

*Primary Examiner* — Vanthu Nguyen
*Assistant Examiner* — Khamdan Alrobaie
(74) *Attorney, Agent, or Firm* — Graeser Associates International Inc; Dvorah Graeser

(57) ABSTRACT

An SRAM memory cell with an internal supply feedback loop is provided herein. The memory cell includes a latch that has a storage node Q, a storage node QB, a supply node, and a ground node. The supply node is coupled via a gating device to a supply voltage and ground node is connected to ground. In addition, storage node Q is fed back via feedback loop into a control node of the gating device. In operation, writing into the memory cell may be carried out in a similar manner to dual port SRAM cells, utilizing one or two write circuitries and for writing into storage node Q and storage node QB respectively. Differently from standard SRAM cells, the feedback loop, by controlling the gating device is configured to weaken the write contention.

17 Claims, 3 Drawing Sheets

300

(Existing Art)

(Existing Art)

ULTRA LOW POWER SRAM CELL CIRCUIT WITH A SUPPLY FEEDBACK LOOP FOR NEAR AND SUB THRESHOLD OPERATION

BACKGROUND

1. Technical Field

Embodiments of the present invention relate to semiconductor memory devices, and more particularly to an ultra low power consumption static random access memory (SRAM) cell that is designed for low voltage operation

2. Discussion of the Related Art

The ongoing demand for ultra low power consumption integrated circuits lead to sub-threshold and near-threshold operation of digital circuits. These circuits utilize very low supply voltages for digital circuit operation, decreasing the dynamic power quadratically, and sufficiently reducing leakage currents. As static power is often the primary factor in a system's power consumption, especially for low to medium performance systems, supply voltage scaling for minimization of leakage currents is essential. Optimal power-delay studies show that the Minimum Energy Point (MEP) is found in the sub-threshold region, where ultra-low power figures are achieved, at the expense of orders-of-magnitude loss in performance.

Low voltage operation of static Complementary Metal Oxide Semiconductor (CMOS) logic is quite straightforward, as its non-ratioed structure generally achieves robust operation under process variations and device mismatch. However, when ratioed designs are put under extreme conditions, maintaining functionality becomes challenging. Global variations change the drive strength ratio between n-channel MOS (nMOS) and p-channel MOS (pMOS) devices, often overcoming the sizing considerations taken into account when designing the circuits. Local mismatch brings an even tougher challenge, as the drive strength ratios between similar devices can be affected, and symmetrically designed circuits can easily lose functionality. At sub and near-threshold supply voltages, these fluctuations in drive strength are often more substantial than the effects of sizing and mobility. Thus, a circuit that is fully operational at the typical process corner or when all devices are slow or fast, may not function at the fast nMOS/slow pMOS (aka FS) or fast pMOS/slow nMOS (aka SF) corners. Even if functionality is achieved at all process corners, local mismatch can cause failure.

FIG. 1 shows a circuit diagram of a standard six-transistor static SRAM cell 100 (write and read circuitry not shown here) according to the prior art. SRAM cell 100 is constructed of a pair of cross coupled static CMOS inverters, which are non-ratioed and therefore operational under process variations at very low supply voltages. However, accessing the data stored in the cell is a ratioed process, including a contention between a pull up and a pull down network in both read and write operations. During nominal strong inversion operation, sizing considerations are incorporated to ensure writeability and readability. However, at low voltages, process variations and mismatch may cause a loss of functionality. As noted above, this is typical to symmetrical topologies. Both theoretical and measured analysis show that standard SRAM blocks such as 100 are limited to operating voltages of no lower than 700 mV.

FIG. 2 shows a circuit diagram of a standard eight-transistor static SRAM cell 200 according to the prior art. Standard eight-transistor static SRAM cell 200 includes the aforementioned six-transistor circuitry and further includes a dual-port write configuration that includes two write circuitries (each for writing a logic '0' to either storage node Q or storage node QB via nMOS access devices M2 and M5 respectively) and a read circuitry with a decoupled read out path (nMOS access devices M7 and M8). It is understood that other write and read circuitries may be used. Standard eight-transistor static SRAM cell 200 features read margins equivalent to its hold margins, however its write margins maintain the aforementioned 700 mV supply limitation.

BRIEF SUMMARY

One aspect of the invention provides an SRAM memory cell with an internal supply feedback loop which is configured to overcome the near and the sub threshold limitations of the write margins of existing SRAM cells. The memory cell includes a latch that has a storage node Q, a storage node QB, a supply node, and a ground node. The supply node is coupled via a gating device to a supply voltage and the ground node is connected to ground. In addition, storage node Q is fed back via feedback loop into a control node of the gating device. In operation, writing into the memory cell may be carried out in a similar manner to dual-port SRAM cells, utilizing one or two write circuitries configured for writing into storage node Q and storage node QB respectively. Differently from standard SRAM cells, the feedback loop, by controlling the gating device is configured to weaken the write contention. Additionally, the feedback loop, by controlling the gating device creates a slight voltage drop at the supply node of latch compared with supply voltage during one of the hold states (creating a so-called sub $V_{DD}$ at the supply node of the latch). This voltage drop causes lower leakage currents at the expense of a slight reduction of noise margins.

Additional, and/or other aspects and/or advantages of the embodiments of the present invention are set forth in the detailed description which follows; possibly inferable from the detailed description, and/or learnable by practice of the embodiments of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

The drawings together with the following detailed description make apparent to those skilled in the art how the invention may be embodied in practice.

DETAILED DESCRIPTION

The following description is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
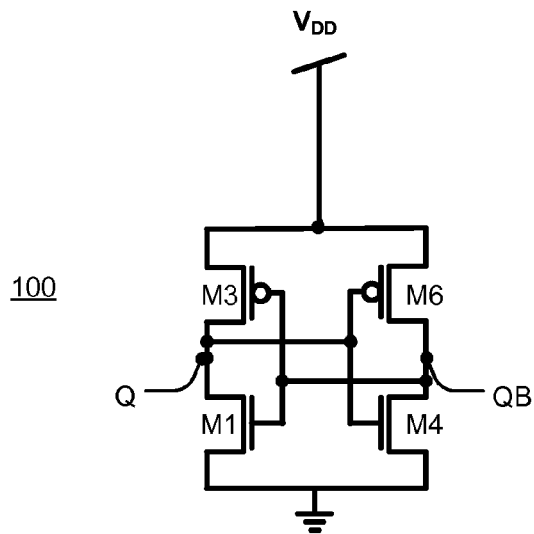
FIG. 1 is a circuit diagram of a conventional 6-transistor SRAM cell according to the existing art.
Figure 2:
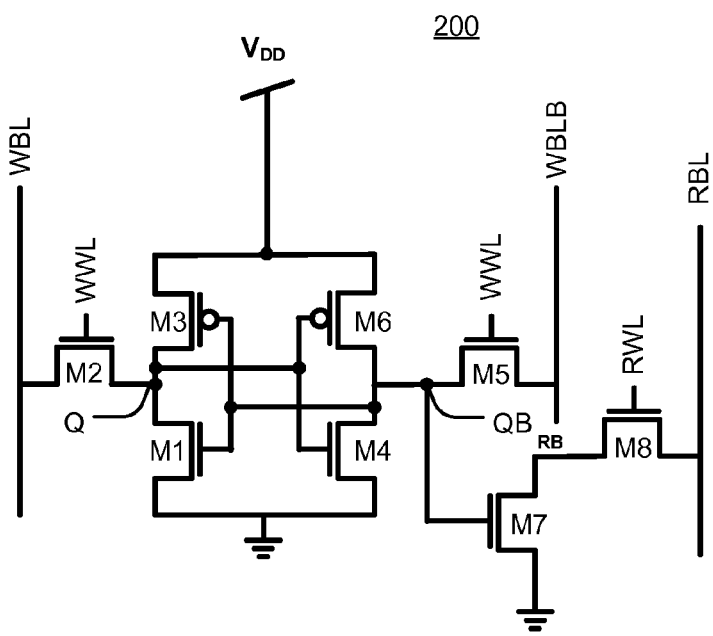
FIG. 2 is a circuit diagram of a conventional 8-transistor SRAM cell according to the existing art.
Figure 3A:
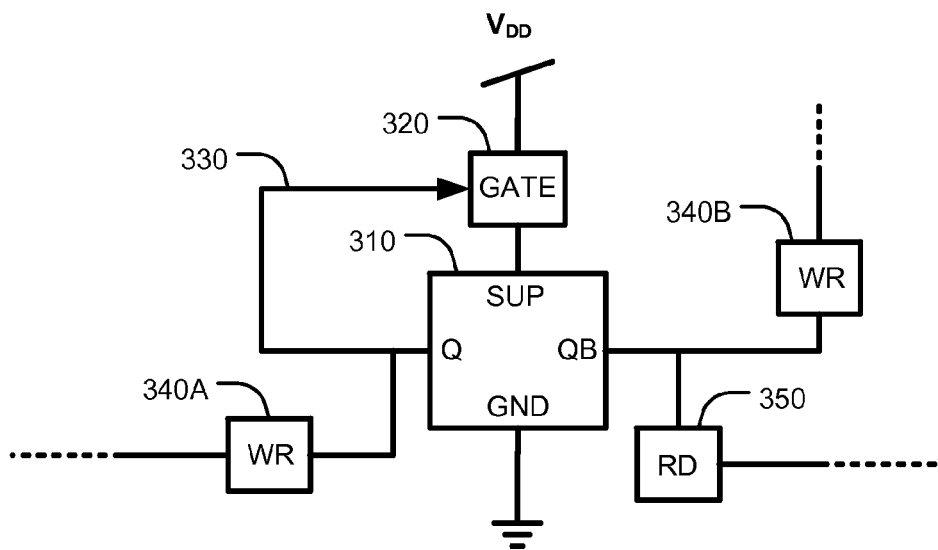
FIG. 3A is a schematic block diagram of a memory cell according to an embodiment of the present invention.

FIG. 3A is a schematic block diagram of a memory cell according to an embodiment of the present invention. The memory cell includes a latch 310 having a storage node Q, a storage node QB, a supply node SUP, and a ground node GND. Supply node SUP is coupled via a gating device 320 to a supply voltage $V_{DD}$ and ground node GND is connected to ground. In addition, storage node Q is fed back via feedback loop 330 into a control node of gating device 320. It is noted that the aforementioned topology may be implemented in various ways as an integrated circuit with one requirement being that the feedback loop 330 is internal to the memory cell from a topology perspective. In other words, feedback loop 330 is physically located between storage node Q and supply voltage bar $V_{DD}$.

In operation, writing into the memory cell may be carried out in a similar manner to dual port SRAM cells, utilizing one or two write circuitry 340A and 340B for writing into storage node Q and storage node QB respectively. It is understood that any write or read circuitry may be used. Feedback loop 330 in cooperation with gating device 320 is configured to weaken the write contention as will be explained in details below. Additionally, feedback loop 330 in cooperation with gating device 320 is configured to create a slight voltage drop at the supply node SUP of latch 310 compared with supply voltage $V_{DD}$ during one of the hold states. This voltage drop causes lower leakage currents at the expense of a slight reduction of noise margins.

Figure 3B:
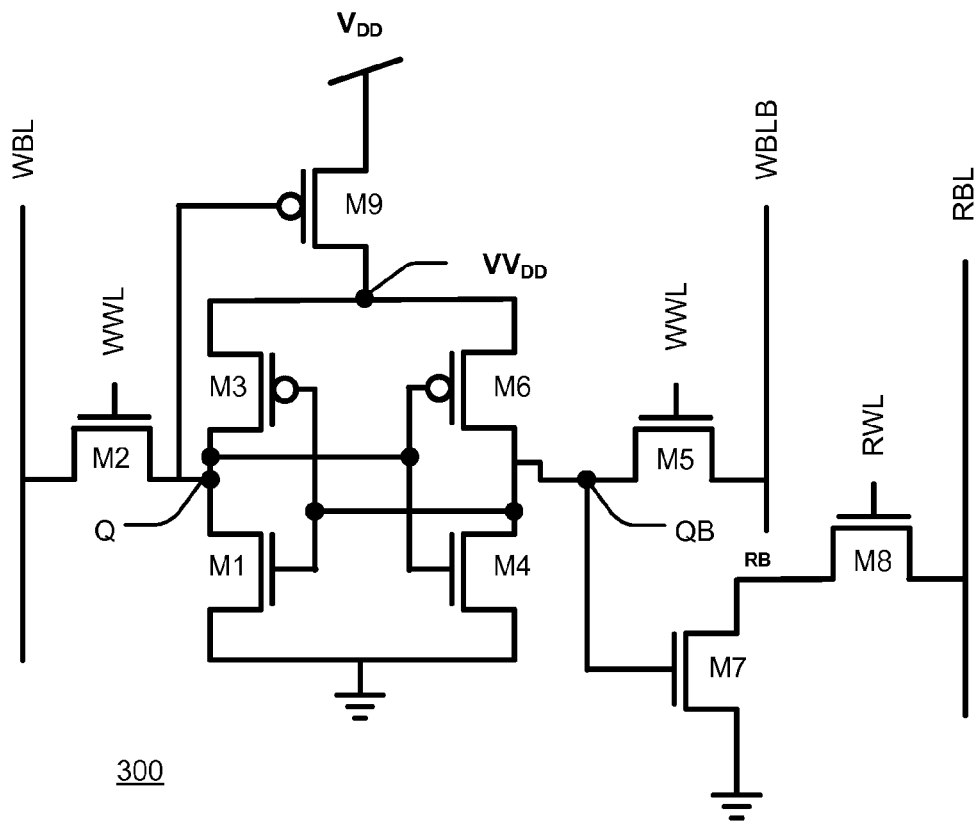
FIG. 3B is a circuit diagram of a an SRAM cell according to an embodiment of the present invention.

FIG. 3B is a circuit diagram showing an exemplary, non-limiting SRAM cell 300 implementing the aforementioned topology according to some embodiments of the present invention. SRAM cell 300 is designed to overcome the write-ability limits of standard SRAM cells (such as the 8T cell and the 6T cell discussed above) due to drive strength ratios between contending devices under process variations. These limits are overcome by utilizing an internal supply feedback loop.

SRAM cell 300 cell is basically an eight transistor SRAM cell (in a dual-port configuration as discussed above) with an internal supply feedback. SRAM cell 300 may be implemented as an integrated circuit and may include the following: an nMOS device M1 having a gate, a source, and a drain; a pMOS device M3 having a gate, a source, and a drain; an nMOS device M4 having a gate, a source, and a drain; a pMOS device M6 having a gate, a source, and a drain; and a pMOS gating device M9 having a gate, a source, and a drain. The source of pMOS device M6, the drain of nMOS device M4, and the gates of nMOS device M1 and pMOS device M3 are connected together forming a storage node QB. The source of pMOS device M3, the drain of nMOS device M1, and the gates of nMOS device M4 and pMOS device M6 are connected together forming a storage node Q. Additionally, the sources of nMOS device M1 and the nMOS device M6 are connected to ground, wherein the drains of pMOS device M3 and pMOS device M6 are connected to the source of pMOS gating device M9, wherein the drain of pMOS gating device M9 is connected to a supply voltage bar $V_{DD}$, and wherein the gate of pMOS gating device M9 is connected to the Q node. The aforementioned five devices M1, M3, M4, M6, and M9 implement a latch (two cross-coupled) inverters with a feedback loop from the Q node to the supply.

In addition to the aforementioned topology, SRAM cell 300 may further includes a first and a second write circuitry, each comprising an nMOS access device (M2 and M5 respectively) and configured to write a logic '0' to the Q node and to the QB node respectively. Finally, SRAM cell 300 further include a read circuitry comprising two nMOS access devices M7 and M8 configured to read from node QB. It is understood that the aforementioned circuit architecture of the write and read circuitries are provided herein merely by way of example and other devices and topologies (such as pMOS access devices) may be used.

As follows from the aforementioned topology, the internal supply feedback is implemented by adding a supply gating device M9 that is connected in a feedback loop to data storage node Q. In operation, the feedback weakens the pull up path of the cell during a write operation, ensuring that the cell flips, even when pMOS devices M6 and M3 are much stronger than nMOS devices M1 and M3. In addition, the internal gating creates a slight voltage drop at the drain $VV_{DD}$ of the supply gating device M9 during one of the hold states. This voltage drop causes lower leakage currents at the expense of a slight reduction of noise margins.

As opposes to symmetric topologies of SRAM cells (such as 100) SRAM cell 300 presents a pair of asymmetric stable states for data storage. For the case of storing a logic '0' (i.e. when storage node Q is discharged), the feedback loop turns on gating pMOS device M9, propagating supply voltage $V_{DD}$ into the virtual supply node, $VV_{DD}$. In such a case, similarly to a standard 6T cell, devices M1, M3, M4 and M6 create a standard pair of cross-coupled Static CMOS inverters, with similar noise margins to an equivalent 8T cell. Storage node QB is therefore charged to $V_{DD}$, providing a strong gate bias for access device M7 and enabling fast single-ended readout (RBL discharge) when RWL is asserted.

The opposite hold state is initiated when storage node Q is being charged and storage node QB is discharged. Now pMOS gating device M9 is cut off as its $V_{SG}$ drops below its threshold voltage. Storage node QB is strongly discharged, as the low resistance of a conducting nMOS device M4 only has to overcome the high serial resistance of disconnected pMOS device M6 and pMOS gating device M9.

Thus, nMOS device M1 is strongly cut off, with a very low gate voltage, resulting in leakage currents mainly due to drain induced barrier lowering (DIBL) resulting from the high state of storage node Q. Additionally, pMOS device M3 is conducting, so that the final state of storage node Q is equivalent to $VV_{DD}$. This is set according to the contention between the primarily DIBL current through nMOS device M1 and the positive $V_{SG}$ which creates a sub-threshold current through pMOS gating device M9, which is much stronger providing a high level. Ultimately, the steady state voltage at node Q is approximately 10% lower than $V_{DD}$, and fluctuates with the $V_T$ implant of the gating device M9.

The read operation of the SRAM cell 300 is equivalent to that of standard eight transistor SRAM cell 200 but are discussed herein merely to illustrate that no reduction in performance occur. The reference to the specific implementation is by way of example only and it is noted that other read circuitries are available. Access devices M7 and M8 implement a read buffer that decouples the readout path from the internal cell storage. Access device M7 is gated by storage node QB, so that when a logic '1' is stored at storage node Q, access device M7 is cut off and when a logic '0' is stored, access device M7 is conducting. A read operation is initiated by pre-charging the read bit line RBL and asserting the read word line RWL. If logic '0' is stored, read bit line RBL is discharged through access devices M7 and M8. If logic '1' is stored, access device M7 blocks the discharge path and read bit line RBL remains at its pre-charged value. A single ended sensing scheme may be used to recognize if read bit line RBL has been discharged or not. Despite the deflated level of node Q when holding a logic '1', node QB is always clamped to $V_{DD}$ or ground, resulting in strong conductance through access device M7 and equivalent read performance to standard eight-transistor SRAM cell 200. This decoupling of the readout path results in a read margin equivalent to the hold margins associated with standard SRAM cells (such as SRAM cell 200), which is sufficient at the full range of supply voltages under global and local process variations. From a performance perspective, the read access time is proportional to a number of design factors, primarily bitline capacitance, sense amplifier sensitivity and drive strength of access devices M7 and M8. Therefore the read performance is application or architecture specific and very controllable according to required specifications. However, it is clear that it degrades severely, similarly to standard eight-transistor SRAM cells, with a reduction of the supply voltage.

In a manner similar to standard eight-transistor SRAM cell 200, the write operation of SRAM cell 300 is initiated by driving the differential write bit lines WBL and WBLB to the level of the data to be written and asserting the write word line WWL. To ensure the success of this operation in a standard eight-transistor SRAM cell 200, the pull down path on the side to be written to '0' must overcome the pull up pMOS that was previously holding the '1' state. As previously mentioned, at strong inversion voltages, this is solved by transconductance ratios, and is easily solved by sizing the pull up pMOS devices equivalent to the nMOS access devices, since hole mobility is lower than electron mobility. However, as the gate voltages approach the device's threshold, the large current fluctuation due to process variations often disrupts this ratio. Therefore, even a downsized pMOS can overcome the access device that may be weakened due to a higher $V_T$, a longer channel length, degraded gate widths, and the like, resulting in a failed write.

In SRAM cell 300, the feedback loop from storage node Q to the gate of pMOS gating device M9 assists in the write operation by weakening the pull up path. Again, as the cell is asymmetric, the operation is quite different for the case of writing logic '1' to a cell holding a '0' and vice versa. Therefore, these two cases will be described separately below.

Figure 4A:
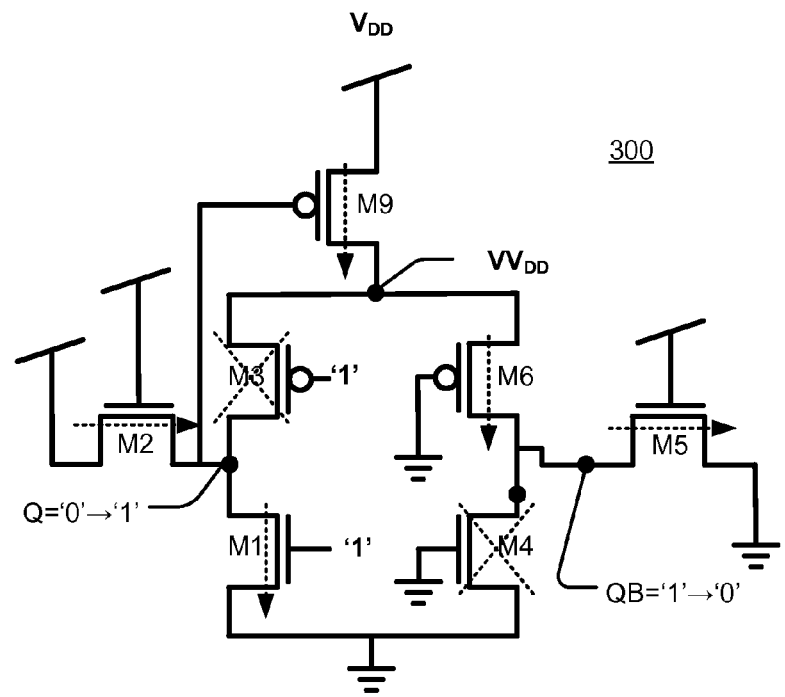
FIGS. 4A and 4B are circuit diagrams showing aspects of the SRAM cell according to some embodiments of the present invention.

FIG. 4A is a circuit diagram that shows how logic '1' is being written to SRAM cell 300 according to some embodiments of the present invention. It is understood that the following explanation is merely by way of illustration and should not be regarded as limiting other embodiments of the invention. The starting point of writing logic '1' is of SRAM cell 300 in the hold '0' state, so that storage node Q is discharged to ground and storage node QB is charged to $V_{DD}$. In order to write logic '1', WBL is driven to $V_{DD}$ and WBLB is discharged to ground. WWL is asserted and the write operation commences (in the figure, M7 and M8 were omitted for the sake of simplicity as they are irrelevant in write operation). Initially, pMOS gating device M9 is strongly conducting, enabling full contention (along with pMOS device M6) to the pull down path through access device M5. Providing that this situation persists, storage node QB would be pulled down towards a steady state voltage between $V_{DD}$ and ground. Under standard conditions, this voltage would be low enough to turn on pMOS device M3 and cut off nMOS device M1, initiating the positive feedback of the cross-coupled inverters and resulting in a successful write. However, under certain conditions, due to process variations, the steady state voltage is high enough not to initiate this feedback and the write would ultimately fail. In this case, the feedback of gating device M9 comes into play. Storage node Q starts to rise due to the contention between nMOS devices M2 and M1. This causes a degradation in the overdrive of pMOS gating device M9 ($V_{SG}=V_{DD}-V_Q$), weakening the pull up current to storage node QB. This is enhanced by the lowering of the voltage at storage node QB, which weakens the overdrive of nMOS device M1, helping nMOS device M2 to overcome the pull down current of nMOS device M1. It should be noted that two additional factors further contribute to this process. First, devices M2 and M1 are both nMOS devices, and so they are affected similarly by global variations, reducing the strong fluctuation prevalent between nMOS device M5 and pMOS device M6. Second, at low voltages, the reduction of the overdrive voltages described above exponentially degrades the current.

Using simulation and by implementing SRAM 300, the inventors have studied the Write '1' margins achieved for standard threshold voltage (SVT). It has been discovered that the great advantage of SRAM cell 300 over standard 8T SRAM cell 200 at the SF corner shows a vast rise in the write margin ratio as the supply voltage is lowered. For example, below 500 mV, the write margin of standard 8T SRAM cell 200 becomes negative, while SRAM cell 300 maintains a positive margin down to below 200 mV under global variations. At the typical corner, SRAM cell 300 provides an advantage over standard 8T SRAM cell 200 at voltages under 700 mV. At higher voltages and in the FS corner, the write margins of SRAM cell 300 during a Write '1' operation are approximately 10% lower than standard 8T SRAM cell 200. However these write margins are still sufficient, as their absolute value is high at these voltages.

Figure 4B:
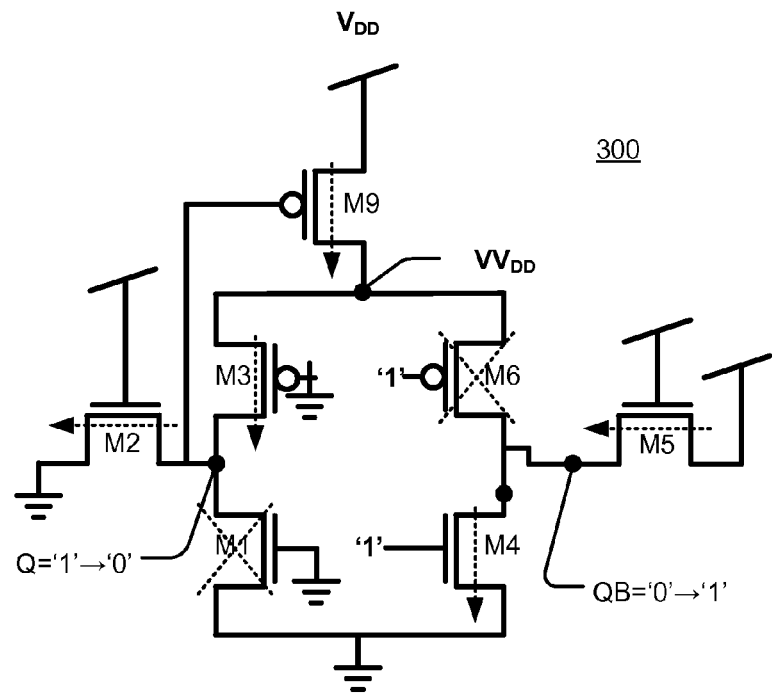

FIG. 4B is a circuit diagram that shows how logic '0' is being written to SRAM cell 300 according to some embodiments of the present invention. The Write '0' operation includes a feedback process similar to writing '1' that provides improved write margins. The starting point is that storage node Q is charged to $V_Q \approx 0.9*V_{DD}$ and that storage node QB is discharged to ground. To write logic '0', WBL is driven to ground and WBLB is charged to $V_{DD}$. Then WWL is asserted, providing with the initial state. The same process as described above is required to successfully flip the cell, but on the opposite side. Specifically, storage node Q has to discharge below the voltage that will initiate the positive feedback that will pull the cross-coupled inverter to the opposite state. For standard eight-transistor SRAM cell 200, the same phenomenon limits functionality to the strong inversion region. But in the case of SRAM cell 300, the state of the bitcell transistors is slightly different. The gate of pMOS gating device M9 is connected to storage node Q, cutting off of pMOS gating device M9, and ultimately weakening the pull-up network of the cell. The negative feedback of this circuit keeps the voltage of storage node Q at the high $V_Q$ level when nMOS access device M2 is off. But with nMOS access device M2 conducting, the off-current of pMOS gating device M9 is no match for the strong discharge current of nMOS access device M2 and storage node Q is easily pulled down. As the voltage at storage node Q drops, nMOS device M4 closes and the pull up current of nMOS access device M5, coupled with the increasing off currents of the path from pMOS gating device M9 through pMOS device M6 are sufficient to charge storage node QB. Eventually the trip point of the circuit is reached, as pMOS gating device M9 turns on, the cross-coupled inverters positive feedback is initiated, and the storage nodes are pulled up to their respective rails.

The inventors further studied the ratios of the Write '0' write margins as compared standard 8T SRAM cell 200 at various process corners through the full range of supply voltages has been carried out. The results of the study show that the behavior is similar to that described for the Write '1' operation, with SRAM cell 300 showing an even higher advantage for this operation. For example, at the typical corner with a supply voltage of 700 mV, the study has shown that the write margin of SRAM cell 300 for the Write '0' operation is 30% higher than the standard eight-transistor SRAM cell 200, whereas for the Write '1' operation it is 5% higher.

In conclusion, and as has been demonstrated above, the primary advantage of SRAM cell 300 is its functionality at ultra-low voltages without the need for additional periphery due to its extended write margins. A secondary advantage of the topology SRAM cell 300, also shown and discussed above, is its internal leakage suppression in the hold '1' state.

Embodiments of the present invention can be utilized in a variety of different types of electronic devices, such as cellular telephones, personal digital assistants, and other types of telecommunications and networking devices, as well as other types of electronic devices like computer systems.

From the foregoing it will be appreciated that, although specific embodiments of the invention have been described herein for purposes of illustration, various modifications may be made without deviating from the spirit and scope of the invention.

What is claimed is:

1. An SRAM cell comprising:
a latch having a supply node, a ground node connected to ground, a storage node Q, and a storage node QB;
a gating device with a control node, the gating device being connected to a voltage supply and to the supply node of the latch; and
a feedback loop connecting the storage node Q with the control node of the gating device,
wherein each one of the storage nodes is connected separately to a respective write circuitry,
wherein the feedback loop controls the gating device responsive to writing to the storage node Q and the storage node QB via the write circuitries, such that write contention is weakened;
wherein the latch comprises a first inverter comprising an nMOS device and a first pMOS device, the first inverter having a ground node connected to ground and a supply node; and a second inverter, comprising a second nMOS device and a second pMOS device, the second inverter being cross-coupled with the first inverter and having a supply node connected to the supply node of the first inverter, and a ground node connected to ground, wherein both of the inverters have a common storage node Q and a common storage node QB; and wherein the gating device and the feedback loop comprises a pMOS gating device having a gate connected to the Q node of the inverters, a source node connected to the supply nodes of the inverters, and a drain node connected to a supply voltage,
wherein in holding a logic '0' at the Q node, the pMOS gating device is configured to conduct such that a voltage level on the supply nodes of the inverters essentially equals the supply voltage, and wherein in holding a logic '1' at the storage node Q, the pMOS gating device is cut-off, such that the voltage level on the supply nodes of the inverters reaches a steady stage voltage of the supply voltage.

2. The SRAM according to claim 1, wherein the feedback loop and the gating device are further configured to decrease the voltage at the supply node of the latch compared with the supply voltage, at least on 'hold' state of the latch, sufficient to decrease leakage currents flowing through the latch.

3. The SRAM cell according to claim 1, wherein in holding of logic '1', the storage node Q settles at a median voltage that equates leakage currents flowing through the pMOS gating device and the first nMOS device, which is gated by the storage node QB which is in turn strongly discharged by the second nMOS device, such that an overdrive on the pMOS gating device configured to equate the leakage of the first nMOS, is significantly reduced.

4. The SRAM cell according to claim 1, further comprising a first and a second write circuitry, each comprising an nMOS access device and configured to write a logic '0' to the storage node Q and to the storage node QB respectively; and a read circuitry comprising two nMOS access devices and configured to read from storage node QB, wherein in writing a logic '0' to the storage node QB, the nMOS access device of the first write circuitry is conducting, and wherein a pull up current flowing through the pMOS gating device and the first pMOS device are set by a leakage current of the pMOS gating device.

5. The SRAM cell according to claim 4, wherein in writing a logic '0' to the storage node Q, a pull-up current flowing to the storage node QB is weakened by a rising voltage at the storage node Q that degrades in turn, an overdrive voltage of the pMOS gating device.

6. The SRAM cell according to claim 4, wherein the pMOS devices are pMOS transistors and wherein the nMOS devices are nMOS transistors.

7. The SRAM cell according to claim 4, wherein the SRAM is a cell within an array of similar SRAM cells all forming a part of an integrated circuit.

8. The SRAM cell according to claim 1, wherein the pMOS gating device is configured to have a low threshold voltage level, to yield a higher noise margin of the SRAM cell, compared with a noise margin of a similar SRAM cell with the pMOS gating device having a standard or high threshold voltages, on account of a higher power consumption thereof.

9. The SRAM cell according to claim 1, wherein the pMOS gating device is configured to have a standard or high threshold voltage levels, to yield a lower power consumption of the SRAM cell, compared with a power consumption of a similar SRAM cell with the pMOS gating device having a low threshold voltage, on account of a lower noise margin thereof.

10. An SRAM cell comprising:
a first nMOS device having a gate, a source, and a drain;
a first pMOS device having a gate, a source, and a drain;
a second nMOS device having a gate, a source, and a drain;
a second pMOS device having a gate, a source, and a drain; and
a pMOS gating device having a gate, a source, and a drain,
wherein the source of the second pMOS device, the drain of the second nMOS device, and the gates of the first nMOS and the first pMOS devices are connected together forming a QB node,
wherein the source of the first pMOS device, the drain of the first nMOS device, and the gates of the second nMOS and the second pMOS devices are connected together forming a Q node,
wherein the sources of the first and the second nMOS devices are connected to ground,
wherein the drains of the first and the second pMOS devices are connected to the source of the gating device,
wherein the drain of the pMOS gating device is connected to a supply voltage, and
wherein the gate of the pMOS gating device is connected to the Q node;
wherein in holding a logic '0' at the Q node, the pMOS gating device is configured to conduct such that a voltage level on the drains of the first and the second pMOS devices essentially equals the supply voltage, and wherein in holding a logic '1' at the Q node, the pMOS gating device is cut-off, such that the voltage level on the drains of first and the second pMOS device reaches a steady stage voltage of the supply voltage.

11. The SRAM cell according to claim 10, wherein in the holding of the logic '1', the storage node Q settles at a median voltage that equates leakage currents flowing through the pMOS gating device and the first nMOS device, which is gated by the storage node Q which is in turn, strongly discharged by the second nMOS device of the second inverter, such that an overdrive on the pMOS gating device to equate the leakage of the first nMOS device is significantly reduced.

12. The SRAM cell according to claim 10, further comprising a first and a second write circuitry, each comprising an nMOS access device and configured to write a logic '0' to the storage node Q and to the storage node QB respectively; and a read circuitry comprising two nMOS access devices and configured to read from storage node QB, wherein in writing a logic '0' to the storage node QB, the nMOS access device of the first write circuitry is conducting, and wherein a pull up current flowing through the pMOS gating device and the first pMOS device are set by a leakage current of the pMOS gating device.

13. The SRAM cell according to claim 12, wherein in writing a logic '0' to the storage node Q, a pull-up current flowing to the storage node QB is weakened by a rising voltage at the storage node Q that degrades in turn, an overdrive voltage of the pMOS gating device.

14. The SRAM cell according to claim 13, wherein the pMOS devices are pMOS transistors and wherein the nMOS devices are nMOS transistors.

15. The SRAM cell according to claim 12, wherein the pMOS gating device is configured to have a low threshold voltage level, to yield a higher noise margin of the SRAM cell, compared with a noise margin of a similar SRAM cell with the pMOS gating device having a standard or high threshold voltages, on account of a higher power consumption thereof.

16. The SRAM cell according to claim 12, wherein the pMOS gating device is configured to have a standard or high threshold voltage levels, to yield a lower power consumption of the SRAM cell, compared with a power consumption of a similar SRAM cell with the pMOS gating device having a low threshold voltage, on account of a lower noise margin thereof.

17. The SRAM cell according to claim 12, wherein the SRAM is a cell within an array of similar SRAM cells all forming a part of an integrated circuit.

* * * * *